(12) United States Patent
Binet et al.

(10) Patent No.: US 11,031,917 B2
(45) Date of Patent: Jun. 8, 2021

(54) METHOD FOR GENERATING A BIAS CURRENT FOR BIASING A DIFFERENTIAL PAIR OF TRANSISTORS AND CORRESPONDING INTEGRATED CIRCUIT

(71) Applicant: STMicroelectronics (Rousset) SAS, Rousset (FR)

(72) Inventors: Vincent Binet, Aix en Provence (FR); Yohan Joly, Meyreuil (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 12 days.

(21) Appl. No.: 16/425,437

(22) Filed: May 29, 2019

(65) Prior Publication Data

US 2019/0372537 A1 Dec. 5, 2019

(30) Foreign Application Priority Data

Jun. 1, 2018 (FR) ...................................... 1854778

(51) Int. Cl.
*H03F 3/45* (2006.01)
(52) U.S. Cl.
CPC .................... *H03F 3/45264* (2013.01); *H03F 2203/45248* (2013.01)

(58) Field of Classification Search
CPC ....................................................... H03F 3/45
USPC ................................ 330/253, 257, 261, 254
See application file for complete search history.

(56) References Cited

U.S. PATENT DOCUMENTS

| | | | |
|---|---|---|---|
| 7,425,867 B2 * | 9/2008 | Aemireddy | H03F 3/4521 330/257 |
| 2004/0051585 A1 * | 3/2004 | Johnson | H03F 3/45085 330/252 |
| 2008/0024217 A1 | 1/2008 | Chiu | |
| 2008/0136523 A1 | 6/2008 | Chiu | |

OTHER PUBLICATIONS

INPI Search Report and Written Opinion for FR 1854778 dated Feb. 7, 2019 (10 pages).

* cited by examiner

*Primary Examiner* — Henry Choe
(74) *Attorney, Agent, or Firm* — Crowe & Dunlevy

(57) ABSTRACT

An operational amplifier integrated circuit includes a differential pair of transistors having a first input, a second input. A bias current generator applies a bias current to an output of the differential pair of transistors. A control loop generates a control voltage arising from a difference in potentials between the first input and the second input. An additional current that is added to the bias current is generated in response to the control voltage.

26 Claims, 4 Drawing Sheets

METHOD FOR GENERATING A BIAS CURRENT FOR BIASING A DIFFERENTIAL PAIR OF TRANSISTORS AND CORRESPONDING INTEGRATED CIRCUIT

PRIORITY CLAIM

This application claims the priority benefit of French Application for Patent No. 1854778, filed on Jun. 1, 2018, the content of which is hereby incorporated by reference in its entirety to the maximum extent allowable by law.

TECHNICAL FIELD

Modes of implementation and embodiments relate to integrated circuits including a differential pair of transistors, such as comparator or operational amplifier integrated circuits.

BACKGROUND

A key parameter of operational amplifiers is the slew rate, which represents the maximum speed of variation of an output of the amplifier for a substantial and rapid input variation, of incremental type.

In an operational amplifier, the slew rate is generally limited by the time taken to charge and to discharge a capacitive element of high capacitance value via a given bias current.

The high capacitance value typically results from the various parasitic capacitive elements of an integrated circuit, such as parasitic Miller capacitances of transistors belonging to the operational amplifier.

It is difficult to correct this type of quantity without affecting the performance of the circuit.

Increasing the intensity of the bias current results in an increase in the steady-state energy consumption.

Thus, there is a need to increase the slew rate without increasing the steady-state current consumption.

SUMMARY

In an embodiment, a method is provided for generating a bias current for biasing at least one differential pair of transistors comprising a first input, a second input, a first intermediate output and a second intermediate output. The method comprises: generating a bias current for biasing the first intermediate output and the second intermediate output; generating a control voltage arising from a difference in potentials between the first input and the second input; and generating an additional current that is added to the bias current, which generation is controlled by the control voltage.

Stated otherwise, it is proposed that the bias current be increased when there is a difference in voltage between the first input and the second input. Specifically, it is when the input voltages of a differential pair of transistors differ, in particular during a rapid variation, that the need for a high slew rate arises. The proposed solution thus allows the slew rate to be increased without increasing the steady-state current consumption (i.e. when the input voltages do not differ).

According to one mode of implementation, said control voltage is generated by a difference in potentials between the potential on the first input and the potential on a node receiving the bias current.

Specifically, in a differential pair of transistors, when the characteristic slew rate of the pair is not sufficient, the potential on the node receiving the bias current takes a certain amount of time to charge and to reach a stable value, and thus the difference in potential between this node and the first input directly makes it possible to control the generation of the additional current.

This makes it possible to correct, by means of feedforward (or control), interference that would result from an insufficient slew rate, i.e. the time taken to charge the node receiving the bias current, only when this interference occurs. In practice, this provides the circuit with an increase in the effective slew rate without increasing the steady-state consumption.

For example, said control voltage is present between a gate terminal and a source terminal, respectively, of an additional transistor, and the additional transistor generates said additional current on said node receiving the bias current.

The method may comprise a decrease in the control voltage that slows said generation of the additional current until it stops, the decrease in the control voltage being caused by the additional current generated by the additional transistor.

According to one mode of implementation, the generation of the control voltage comprises an amplification of a difference signal resulting from a determined difference between the potentials on the first input and on the second input.

This makes it possible to generate an additional current controlled by an amplified signal, which is advantageous in particular in terms of design freedom.

According to one mode of implementation, said generation of a control voltage comprises a generation of a first control voltage arising from a positive difference in potentials between the first input and the second input, and a generation of a second control voltage arising from a negative difference in potentials between the first input and the second input, and wherein said generation of the additional current comprises a generation of a first additional current being added to the bias current, which generation is controlled by the first control voltage, and a generation of a second additional current that is added to the bias current, which generation is controlled by the second control voltage.

The first additional current controlled by the first control voltage allows the response of the differential pair of transistors to a rising signal to be improved, and the second additional current controlled by the second control voltage allows the response of the differential pair of transistors to a falling signal to be improved, thereby enhancing the effective slew rate for both positive variations and negative variations.

According to another aspect, an integrated circuit comprising at least one differential pair of transistors comprising a first input, a second input, a first intermediate output, a second intermediate output, and a bias current generator configured to generate a bias current for biasing the first intermediate output and the second intermediate output is proposed, the integrated circuit including a feedforward (or control) loop that is configured to generate a control voltage arising from a difference in potentials between the first input and the second input, and to generate an additional current that is added to the bias current, which generation is controlled by the control voltage.

According to one embodiment, said feedforward (or control) loop is configured to generate said control voltage by a difference in potentials between the potential on the first input and the potential on a node that is intended to receive the bias current.

For example, the feedforward (or control) loop comprises an additional transistor that is intended to generate said additional current on said node that is intended to receive the bias current, and is configured to generate said control voltage between a gate terminal and a source terminal, respectively, of the additional transistor.

The feedforward (or control) loop may be configured such that the additional current generated by the additional transistor causes a decrease in said control voltage, which by itself slows said generation of the additional current until it stops.

According to one embodiment, the feedforward (or control) loop comprises an amplifier that is configured to determine a difference in the potentials on the first input and on the second input, and to amplify a signal resulting from the difference so as to generate said control voltage.

According to one embodiment, said feedforward (or control) loop is configured to generate, as said control voltage, a first control voltage arising from a positive difference in potentials between the first input and the second input and a second control voltage arising from a negative difference in potentials between the first input and the second input, and to generate, as said additional current, a first additional current that is added to the bias current, which generation is controlled by the first control voltage, and a second additional current that is added to the bias current, which generation is controlled by the second control voltage.

The integrated circuit may advantageously incorporate an operational amplifier including said differential pair of transistors.

BRIEF DESCRIPTION OF THE DRAWINGS

Other advantages and features of the invention will become apparent on examining the detailed description of wholly non-limiting embodiments and modes of implementation, and the appended drawings in which.

DETAILED DESCRIPTION

Figure 1:
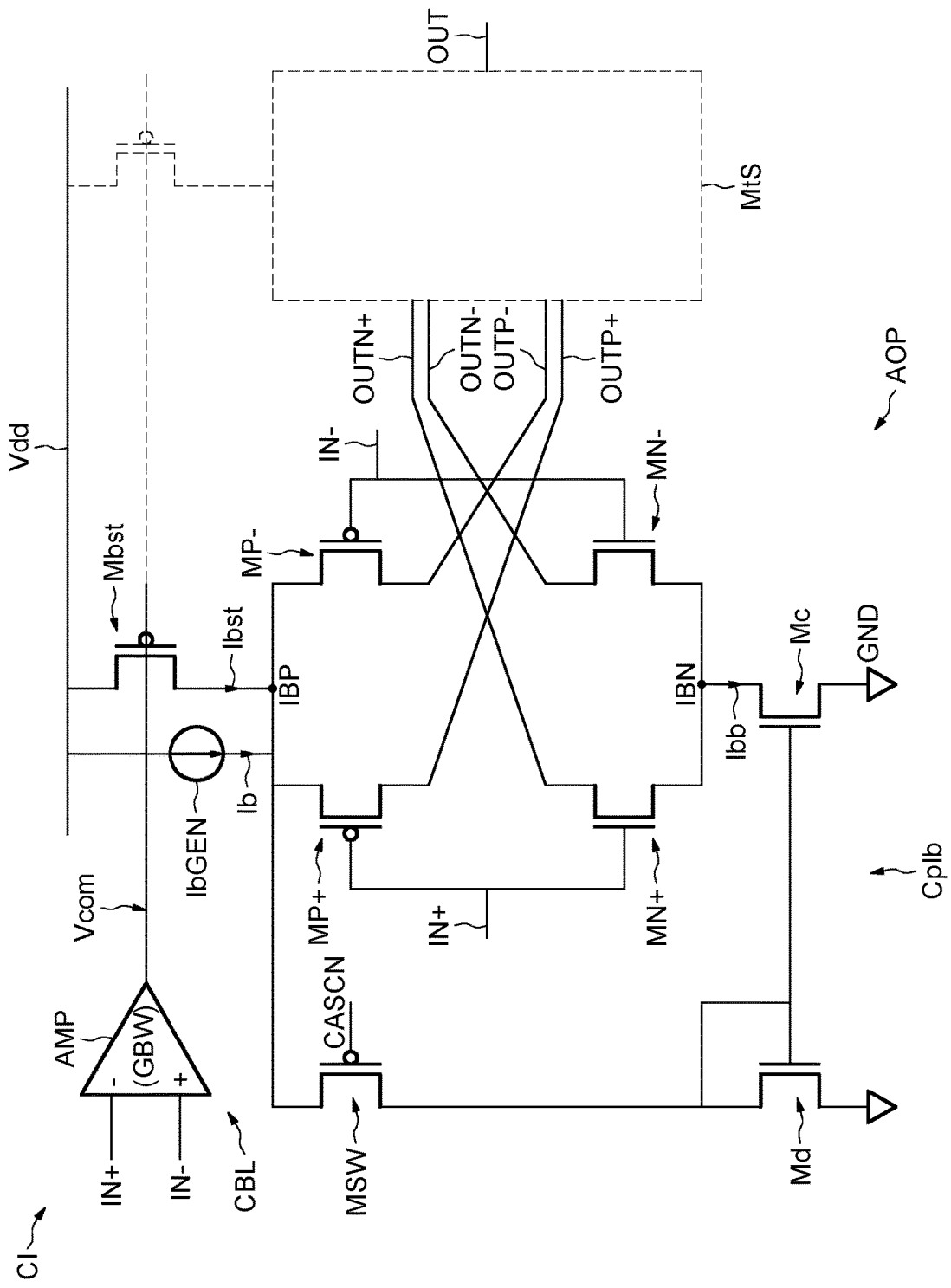
FIG. 1 is a circuit diagram of an operational amplifier.

FIG. 1 shows an example of an integrated circuit CI, including here an operational amplifier AOP, including a first differential pair of transistors MP+/MP−, and a second differential pair of transistors MN+/MN− that are supplied with power by a bias current generator IbGEN and a feedforward (or control) loop CBL. The operational amplifier AOP includes other conventional elements, which are not shown in detail here for the sake of simplicity, such as an output stage MtS.

The first differential pair of transistors includes two p-channel MOS transistors, referred to as "pMOS transistors", referenced MP+ and MP−. The first differential pair is thus referred to as the "p-conducting differential pair".

The sources of the pMOS transistors MP+, MP− of the first differential pair are commonly connected to a first bias node IBP, the gate of one (MP+) is coupled to a first input IN+, the gate of the other (MP−) is coupled to a second input IN−, and, respectively, the drain of one (MP+) is coupled to a first intermediate output OUTP+ while the drain of the other (MP+) is linked to a second intermediate output OUTP−. The intermediate outputs OUTP+, OUTP− of the p-conducting differential pair are referred to as "p-conducting intermediate outputs".

Symmetrically, the second differential pair of transistors includes two n-channel MOS transistors, referred to as "nMOS transistors", referenced MN+ and MN−. The second differential pair is thus referred to as the "n-conducting differential pair".

The sources of the nMOS transistors MN+, MN− of the second differential pair are commonly connected to a second bias node IBN, the gate of one (MN+) is coupled to said first input IN+, the gate of the other (MN−) is coupled to said second input IN−, and, respectively, the drain of one (MN+) is coupled to another first intermediate output OUTN+ while the drain of the other (MN−) is linked to another second intermediate output OUTN−. The intermediate outputs OUTN+, OUTN− of the n-conducting differential pair are referred to as "n-conducting intermediate outputs".

The first bias node IBP is connected to a bias current generator IbGEN. The bias current generator IbGEN is configured to generate a bias current Ib that is intended to bias the first intermediate output OUTP+ and the second intermediate output OUTP− of the p-conducting differential pair.

The second bias node IBN is connected to a current mirror CpIb including a transistor connected as a diode Md and a current-copying transistor Mc controlled by the gate voltage of the transistor connected as a diode Md. The current mirror CpIb is configured to copy the bias current Ib output by the bias current generator IbGEN, and to apply the copied current Ibb to the second bias node IBN. The copied bias current Ibb is intended to bias the first intermediate output OUTN+ and the second intermediate output OUTN− of the n-conducting differential pair.

A switch MSW allows the current mirror CpIb to be connected to the output of the bias current generator IbGEN when using the n-conducting differential pair, and to be disconnected therefrom when using the p-conducting differential pair.

For example, the switch MSW is a pMOS transistor controlled by a signal CASCN allowing this effect in relation with the source voltage of the pMOS transistor.

In operation, the p- and n-conducting differential pairs are configured to allow a differential current Idiff to flow from the respective bias node to the respective first intermediate output OUTP+, OUTN+ and/or the respective second intermediate output OUTP−, OUTN−. The flow of the differential current Idiff is controlled by the potentials that are present on the first input IN+ and on the second input IN−.

The first and second p-conducting and n-conducting intermediate outputs (OUTP+, OUTP−, OUTN+, OUTN−) are sent to an output circuit MtS that is, for example, intended to a deliver a voltage output signal OUT on the basis of four intermediate output signals over the four intermediate outputs OUTP+, OUTP−, OUTN+, OUTN−.

For example, the output circuit MtS may comprise a class AB Monticelli output stage circuit.

The integrated circuit CI further includes a feedforward (or control) loop CBL that is configured to generate a control voltage Vcom arising from a difference in potentials between the first input IN+ and the second input IN−. The feedforward (or control) loop CBL is also configured to generate an additional current Ibst that is added to the bias current Ib, which generation is controlled by the control voltage Vcom.

In this example, the feedforward (or control) loop CBL comprises a differential amplifier AMP that is configured to determine the difference in the potentials on the first input IN+ and on the second input IN−, and to deliver an amplified signal that is representative of the difference. The amplified signal may directly form the control voltage Vcom.

The control voltage Vcom allows an additional current generator to be controlled, which generator is capable of generating an additional current Ibst that is added to the bias current Ib. The additional current generator may be incorporated within the bias current generator.

In this example, the first input IN+ is applied to an inverting input (−) of the amplifier AMP, and the second input IN− is applied to a follower input (+) of the amplifier AMP. The signal amplified by subtracting the value on the inverting input (−) from the value of the follower input (+) may form the control signal Vcom. The signal Vcom may thus control a pMOS transistor to allow a current that is proportional to this difference to flow.

Thus, in this example, the additional current generator of the feedforward (or control) loop CBL is obtained by means of a pMOS transistor Mbst, which is controlled over its gate by the control voltage Vcom, and the conduction terminals of which are coupled to a power supply terminal Vdd and to the output IBP of the bias current generator IbGEN, respectively.

The assembly comprising the differential pairs of transistors and the output circuit MtS, for example in the context of application to an operational amplifier, is referred to as the "main loop".

For example, the gain-bandwidth product GBW of the amplifier AMP may be greater than 10 times the gain-bandwidth product of the main loop.

By construction, the amplifier AMP has only very little gain constraint for generating the control voltage Vcom. Thus, it is a simple matter to design such a feedforward (or control) loop CBL that reacts faster than the main loop.

Furthermore, as shown by the dashed lines in FIG. 1, the control voltage Vcom may allow second additional current generators, which are of the same nature as the additional current generator Mbst, to be controlled. The second additional current generators may thus allow second additional currents to be generated that can be used to optimize, as needed, other portions of the integrated circuit CI, such as for example the output circuit MtS.

Figure 2:
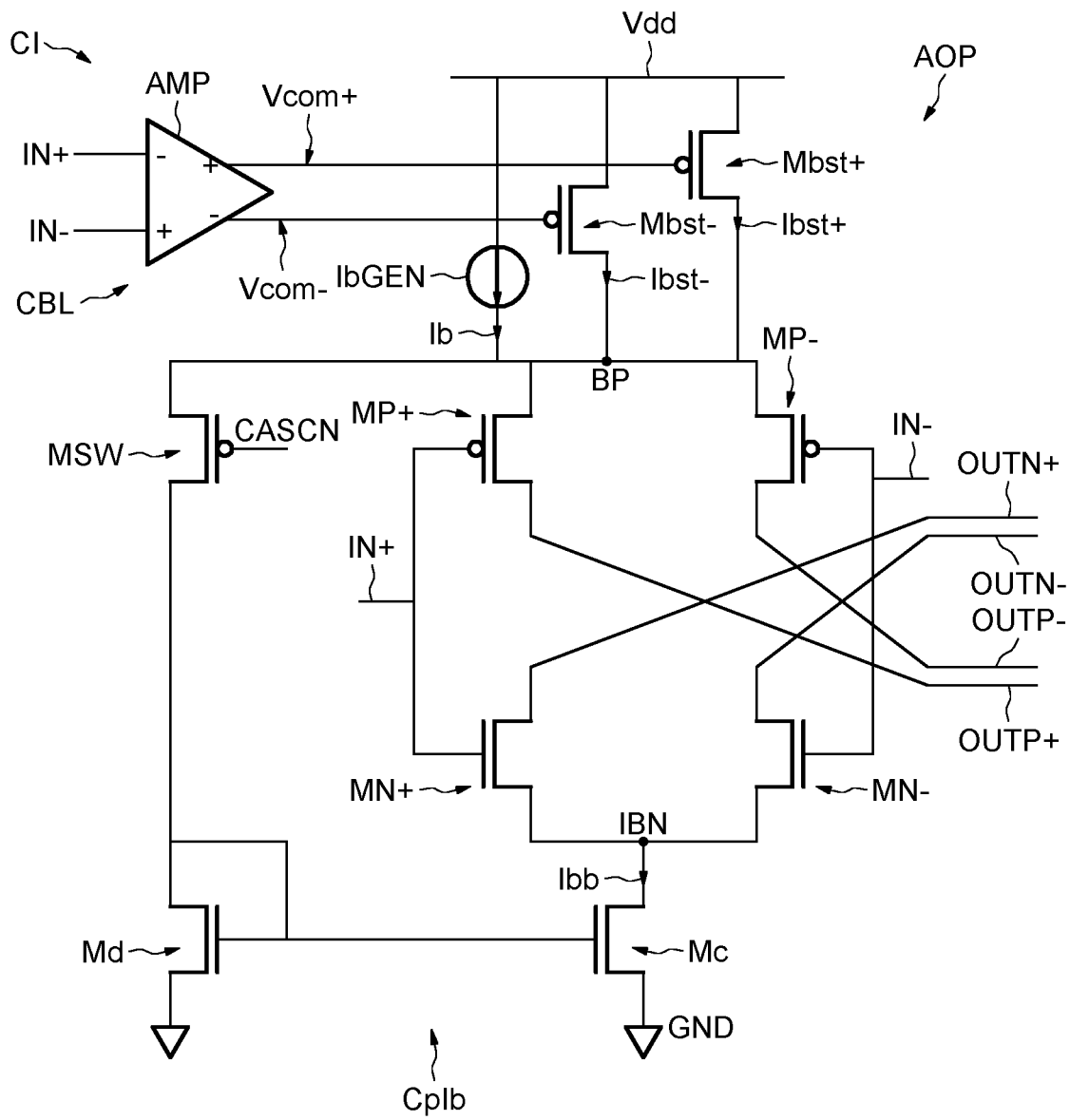
FIG. 2 is a circuit diagram of an alternative operational amplifier.

FIG. 2 shows one example of a variant of the integrated circuit CI described above with reference to FIG. 1. The common elements bear the same references and are not described in detail again here.

In this variant, the feedforward (or control) loop CBL is configured to generate a first control voltage Vcom+ arising from a positive difference in potentials between the first input IN+ and the second input IN−, and a second control voltage Vcom− arising from a negative difference in potentials between the first input IN+ and the second input IN−. This allows a first additional current Ibst+ that is controlled by the first control voltage Vcom+ and a second additional voltage Ibst− that is controlled by the second control voltage Vcom− to be generated.

To this end, this example proposes generating the first control voltage Vcom+ on an inverting output (−) of the amplifier AMP and the second control voltage on a follow output (+) of the amplifier AMP, the first input IN+ being applied to the follower input (+) of the amplifier AMP, and the second input IN− to the inverting input (−) of the amplifier AMP.

Thus, the first and second control signals Vcom+, Vcom− allow a respective pMOS transistor to be controlled so as to allow a current that is proportional to a difference between the first and the second input, which is positive or negative, respectively, to flow.

A first pMOS transistor Mbst+ and a second pMOS transistor Mbst− are coupled to a power supply terminal Vdd and to the output of the bias current generator IbGEN.

The first transistor Mbst+ is controlled over its gate by the first control voltage Vcom+ and allows a first additional current Ibst+ to be generated that allows the response of the differential pairs to a rising signal to be improved.

The second transistor Mbst− is controlled over its gate by the second control voltage Vcom− and allows a second additional current Ibst− to be generated that allows the response of the differential pairs to a falling signal to be improved.

Figure 3:
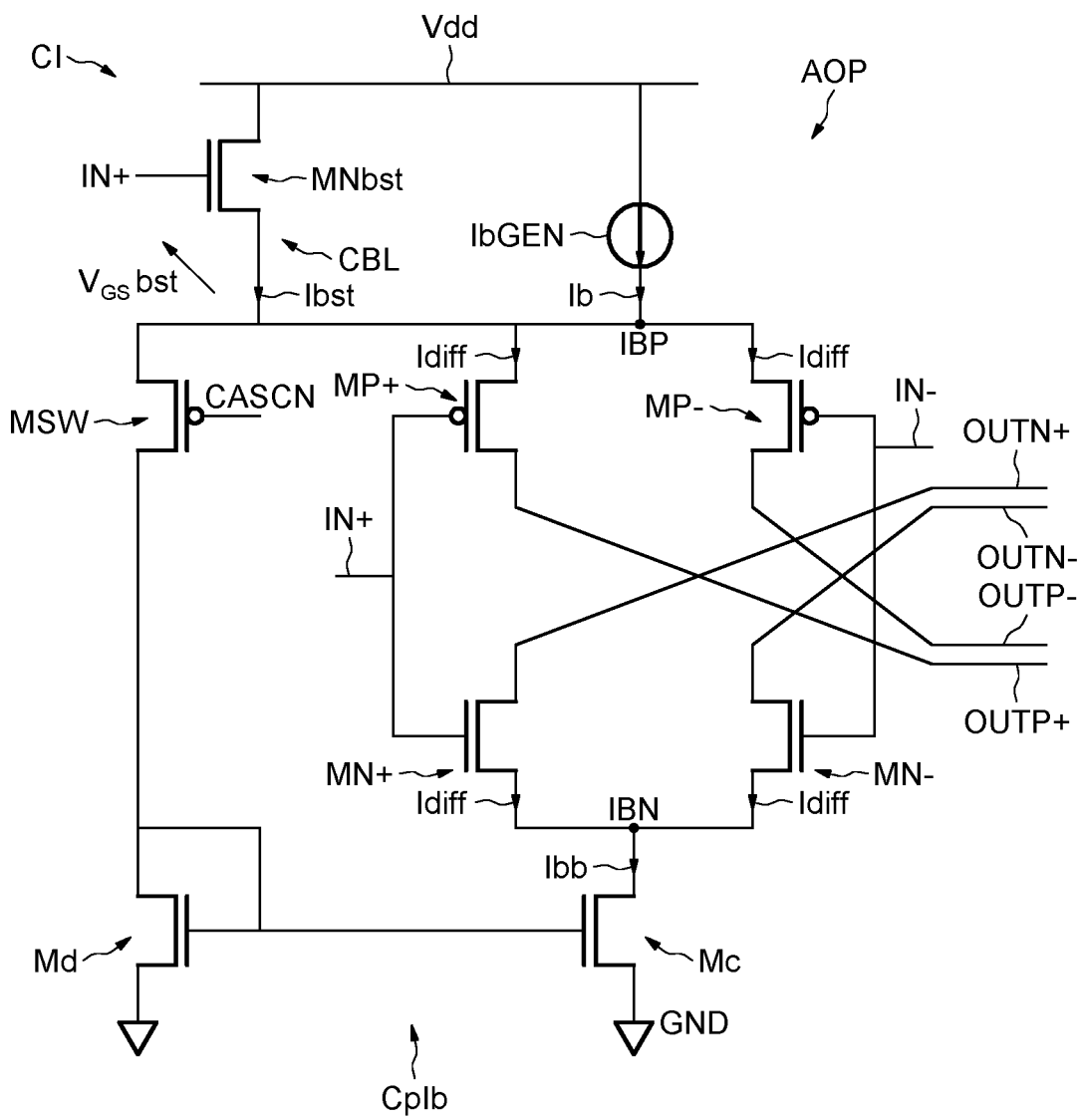
FIG. 3 is a circuit diagram of an further alternative operational amplifier.

FIG. 3 shows another example of an integrated circuit CI such as an operational amplifier, including a first differential pair of transistors MP+/MP−, and a second differential pair MN+/MN−, that are arranged in a similar manner to the two differential pairs of the integrated circuit described above with reference to FIG. 1. The common elements bear the same references and are not described in detail again here.

As such, the feedforward (or control) loop CBL that is configured to generate a control voltage $V_{GS}$bst controlling the generation of an additional current Ibst that is added to the bias current Ib is described here with reference to FIG. 3 according to one preferred embodiment.

In this preferred embodiment, the feedforward (or control) loop CBL is configured to generate said control voltage $V_{GS}$bst by a difference in potentials between the potential on the first input IN+ and the potential on the first bias node IBP receiving the bias current Ib.

The feedforward (or control) loop CBL comprises an additional nMOS transistor MNbst that is intended to generate said additional current Ibst on the first bias node IBP. The additional transistor MNbst is coupled, via its drain, to a supply voltage terminal Vdd and, via its source, to the first bias node IBP.

The additional transistor MNbst receives, via its gate, the first input voltage IN+.

Thus, the feedforward (or control) loop CBL is configured to generate the control voltage $V_{GS}$bst between the gate terminal and the source terminal, respectively, of the additional transistor MNbst.

Thus, the control voltage $V_{GS}$bst is equal to the potential on the first input IN+ subtracted from the potential on the first bias node IBP ($V_{GS}bst=V_{IN+}-V_{IBP}$).

The additional current Ibst that is added to the bias current Ib is thus generated by the additional transistor MNbst controlled by the control voltage $V_{GS}$bst.

The additional current Ibst generated by the additional transistor MNbst results in the first bias node IBP being charged, causing said control voltage VGSbst to decrease and thus slowing said generation of the additional current Ibst, until it stops.

Stated otherwise, the variation in the voltage on the bias node IBP, when the additional current Ibst is flowing, is used to control the generation, on this same node IBP, of said additional current Ibst so as to make it stop.

So, this embodiment makes it possible to correct, via the feedforward (or control) loop, a slow charging time of the bias node IBP, which would be representative of an insufficient characteristic slew rate of the main loop. In practice, this provides the circuit with an increase in the effective slew rate without introducing an increase in the steady-state current consumption.

Figure 4:
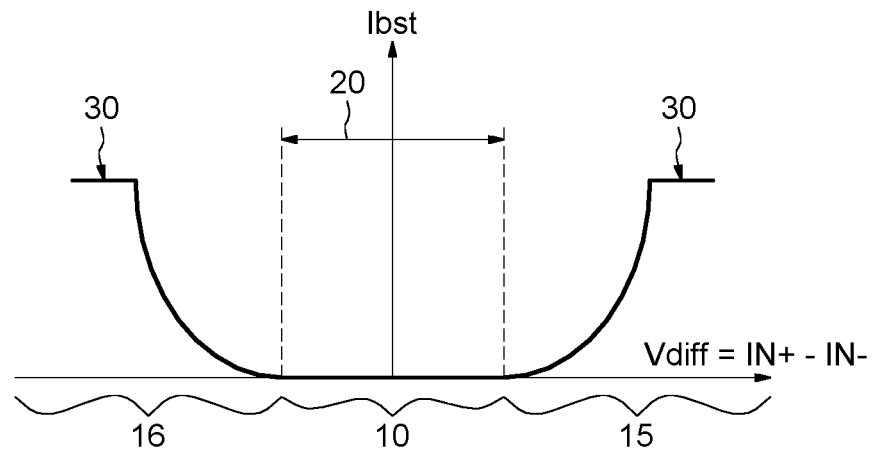
FIGS. 4 and 5 are graphs illustrating operation of the operational amplifier.

FIG. 4 shows a graph illustrating examples of advantageous configurations of the feedforward (or control) loop CBL.

These features apply both to the examples of feedforward (or control) loop CBL configurations described with reference to FIGS. 1 and 2 and to the example described with reference to FIG. 3.

The graph Gr shows the functional relationship for generating the additional current Ibst with respect to a differential input voltage Vdiff that is equal to the difference between the first and second input voltages: Vdiff=$V_{IN+}$−$V_{IN-}$.

The relationship for generating the additional current Ibst (Ibst=f{Vdiff}) may be an exponential function, but it could also be a linear function.

An input offset 20 may be configured to prevent the feedforward (or control) loop CBL from taking effect at the same time as the main loop when the voltages on the inputs IN+ and IN− are close (i.e. when the differential voltage Vdiff is close to 0). This input offset 20 allows instabilities, such as oscillations, to be avoided. The input offset 20 of the feedforward (or control) loop CBL is greater than the input offset of the main loop.

The feedforward (or control) loop CBL is advantageously configured to be independently stable, in its own operation. For example, in the embodiments described above with reference to FIGS. 1 and 2, the amplifier AMP will be configured to be stable over a range of input values (+, −) that is at least equal to the range of input values IN+, IN− specified for the main loop.

With reference to the exemplary embodiment described with reference to FIG. 2, the functional relationship may advantageously be symmetrical with respect to the vertical axis (Vdiff=0). The right-hand side 15 of the relationship represents generating the first additional current Ibst+ enhancing the response of the differential pairs to a rising variation in the differential voltage Vdiff. The left-hand side 16 of the relationship represents generating the second additional current Ibst− enhancing the response of the differential pairs to a falling variation in the differential voltage Vdiff.

A saturation upper limit 30 may be configured to avoid generating an additional current Ibst that is high enough to interfere with the stability of the main loop.

Figure 5:
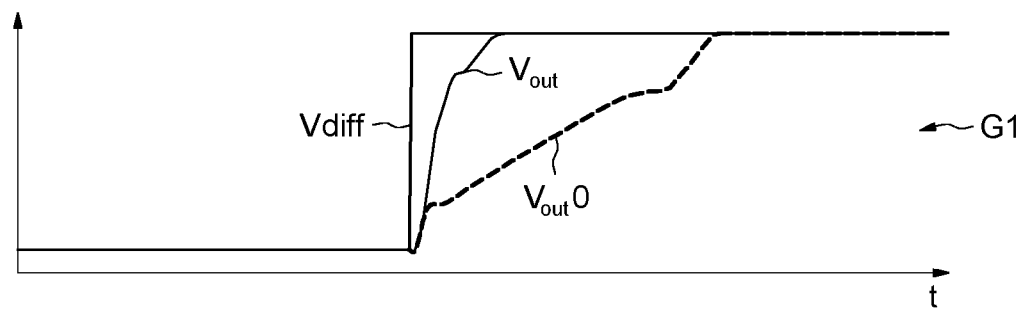
Figure 5:
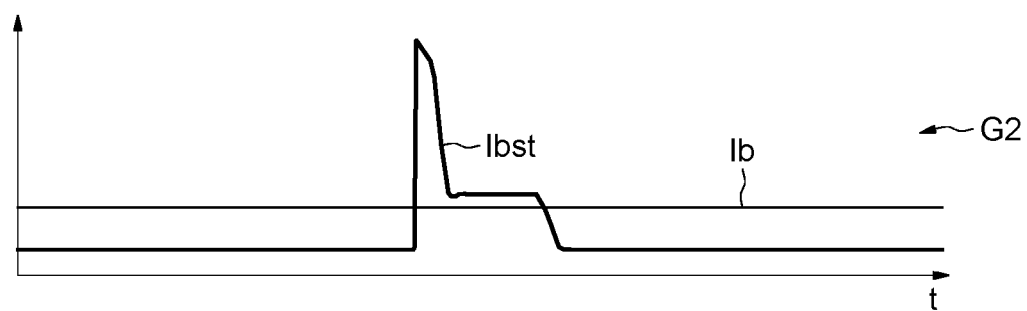

FIG. 5 shows graphs G1, G2 illustrating quantities varying with time, during the operation of the integrated circuit CI applied to an operational amplifier connected in follower configuration.

The graph G1 shows the response $V_{OUT}$ of the follower circuit to a step signal Vdiff and the response $V_{OUT}0$ of a device that is equivalent but does not include a feedforward (or control) loop CBL.

Graph G2 shows the behavior of the bias current Ib and of the additional current Ibst such as implemented to generate the response $V_{OUT}$.

The graphs G1 and G2 are aligned on the same time axis t.

The bias current Ib is constant, at a low steady-state value, for example of the order of 20 μA.

Before stepping the signal Vdiff, the value of the additional current Ibst is zero. Almost immediately after the step transition, an additional current Ibst spike is generated. The additional current then drops down to a lower value than the level of the spike so as to charge the node receiving the bias current until reaching its steady-state potential. Once the transition has been handled by the follower circuit, the additional current Ibst drops back down to a zero value.

The bias current Ib is not negatively affected by the generation of the additional current.

This allows the output of the follower circuit $V_{OUT}$ to reach a stable steady-state value much more quickly than the response $V_{OUT}0$ of a typical circuit, without increasing the steady-state bias current. Thus, the embodiments and modes of implementation make it possible to increase the slew rate without increasing the current consumption.

Furthermore, the invention is not limited to these embodiments but encompasses all variants thereof; for example, the p- or n-conduction types of the channel regions of the pMOS or nMOS transistors given in the exemplary embodiments may be mutually inverted in an equivalent dual structure, in which, in particular the power supplies are also inverted.

The invention claimed is:

1. A method for generating a bias current for biasing a differential pair of transistors which include a first input, a second input, a first intermediate output, a second intermediate output, the method comprising:
   generating a bias current for biasing the first intermediate output and the second intermediate output;
   generating a control voltage arising from a difference in potentials between a potential on the first input and a potential on a node receiving the bias current; and
   generating in response to the control voltage an additional current that is added to the bias current.

2. The method according to claim 1, wherein said control voltage is present between a gate terminal and a source terminal, respectively, of an additional transistor, the additional transistor generating said additional current on said node receiving the bias current.

3. The method according to claim 2, further comprising decreasing said control voltage so as to slow said generation of the additional current until it stops, wherein the decrease in the control voltage is caused by the additional current generated by the additional transistor.

4. A method for generating a bias current for biasing a differential pair of transistors which include a first input, a second input, a first intermediate output, and a second intermediate output, the method comprising:
   generating a bias current for biasing the first intermediate output and the second intermediate output;
   generating a control voltage arising from a difference in potentials between the first input and the second input by amplifying a difference signal resulting from a difference between the potential on the first input and the potential on the second input; and
   generating in response to the control voltage an additional current that is added to the bias current;
   wherein generating the control voltage comprises:
     generating a first control voltage arising from a positive difference in potentials between the first input and the second input, and
     generating a second control voltage arising from a negative difference in potentials between the first input and the second input, and
   wherein generating the additional current comprises:
     generating in response to the first control voltage a first additional current being added to the bias current, and
     generating in response to the second control voltage a second additional current that is added to the bias current.

5. An integrated circuit, comprising:
a differential pair of transistors including a first input, a second input, a first intermediate output, a second intermediate output;
a bias current generator configured to generate a bias current for biasing the first intermediate output and the second intermediate output; and
a control loop configured to generate a control voltage arising from a difference in potentials between a potential on the first input and a potential on a node that is configured to receive the bias current, and to generate in response to the control voltage an additional current that is added to the bias current for biasing the first intermediate output and the second intermediate output.

6. The integrated circuit according to claim 5, wherein said control loop comprises an additional transistor configured to generate said additional current on said node, and is configured to generate said control voltage between a gate terminal and a source terminal, respectively, of the additional transistor.

7. The integrated circuit according to claim 6, wherein said control loop responds to the additional current generated by the additional transistor by causing a decrease in said control voltage for slowing said generation of the additional current.

8. An integrated circuit, comprising:
a differential pair of transistors including a first input, a second input, a first intermediate output, a second intermediate output;
a bias current generator configured to generate a bias current for biasing the first intermediate output and the second intermediate output;
a control loop configured to generate a control voltage arising from a difference in potentials between the first input and the second input, and to generate in response to the control voltage an additional current that is added to the bias current for biasing the first intermediate output and the second intermediate output;
wherein the control loop comprises an amplifier configured to determine a difference between a potential on the first input and a potential on the second input, and to amplify a signal resulting from the difference so as to generate said control voltage; and
wherein said control loop is configured to generate, as said control voltage, a first control voltage arising from a positive difference in potentials between the first input and the second input and a second control voltage arising from a negative difference in potentials between the first input and the second input, and to generate, as said additional current, a first additional current that is added to the bias current, which generation is controlled by the first control voltage, and a second additional current that is added to the bias current, which generation is controlled by the second control voltage.

9. The integrated circuit according claim 8, wherein said differential pair of transistors are input transistors for an operational amplifier.

10. An integrated circuit, comprising:
a first differential pair of transistors including a first input, a second input, and a first common source bias node;
a second differential pair of transistors including a third input, a fourth input, and a second common source bias node;
a first current source configured to source a first bias current to the common source bias node;
a transistor configured to generate a second bias current for application to the common source bias node;
an amplifier circuit having a first input configured to receive a voltage at the first input and a second input configured to receive a voltage at the second input, the amplifier circuit configured to determine a difference between the voltage at the first and second inputs and output a control voltage for application to a control terminal of said transistor; and
a switched circuit configured to selectively apply the first and second bias currents to the second common source bias node in response to a control signal.

11. The integrated circuit of claim 10, wherein the first and third inputs are connected together and wherein the second and fourth inputs are connected together.

12. The integrated circuit of claim 10, wherein the first differential pair of transistors further include first differential outputs, further comprising an output amplifier stage having inputs coupled to the first differential outputs.

13. The integrated circuit of claim 12, wherein a gain bandwidth product of the amplifier circuit is substantially greater than a gain bandwidth product of the combined first differential pair of transistors and output amplifier.

14. The integrated circuit of claim 12, further comprising an additional transistor configured to generate a third bias current for application to bias the output amplifier, and wherein the control voltage is further applied to a control terminal of said additional transistor.

15. An integrated circuit, comprising:
a first differential pair of transistors including a first input, a second input, and a first common source bias node;
a first current source configured to source a first bias current to the common source bias node;
a first transistor configured to generate a second bias current for application to the common source bias node;
a second transistor configured to generate a third bias current for application to the common source bias node; and
an amplifier circuit having a first input configured to receive a voltage at the first input and a second input configured to receive a voltage at the second input, the amplifier circuit configured to determine a difference between the voltage at the first and second inputs and output a differential control voltage having a first control voltage for application to a control terminal of said first transistor and a second control voltage for application to a control terminal of said second transistor.

16. The integrated circuit of claim 15, further comprising:
a second differential pair of transistors including a third input, a fourth input, and a second common source bias node;
a switched circuit configured to selectively apply the first, second and third bias currents to the second common source bias node in response to a control signal.

17. The integrated circuit of claim 16, wherein the first and third inputs are connected together and wherein the second and fourth inputs are connected together.

18. The integrated circuit of claim 15, wherein the first differential pair of transistors further include first differential outputs, further comprising an output amplifier stage having inputs coupled to the first differential outputs.

19. The integrated circuit of claim 18, wherein a gain bandwidth product of the amplifier circuit is substantially greater than a gain bandwidth product of the combined first differential pair of transistors and output amplifier.

20. The integrated circuit of claim 18, further comprising an additional transistor configured to generate a third bias current for application to bias the output amplifier, and wherein the control voltage is further applied to a control terminal of said additional transistor.

21. An integrated circuit, comprising:
   a first differential pair of transistors including a first input, a second input, and a first common source bias node;
   a second differential pair of transistors including a third input, a fourth input, and a second common source bias node;
   a first current source configured to source a first bias current to the common source bias node;
   a transistor having a gate node connected to the first input and a source node connected to the common source bias node, wherein a second bias current is generated at the source node for application to the common source bias node; and
   a switched circuit configured to selectively apply the first and second bias currents to the second common source bias node in response to a control signal.

22. The integrated circuit of claim 21, wherein the first and third inputs are connected together and wherein the second and fourth inputs are connected together.

23. The integrated circuit of claim 21, wherein the first differential pair of transistors further include first differential outputs, further comprising an output amplifier stage having inputs coupled to the first differential outputs.

24. The integrated circuit of claim 23, wherein a gain bandwidth product of the amplifier circuit is substantially greater than a gain bandwidth product of the combined first differential pair of transistors and output amplifier.

25. The integrated circuit of claim 23, further comprising an additional transistor configured to generate a third bias current for application to bias the output amplifier, and wherein the control voltage is further applied to a control terminal of said additional transistor.

26. The integrated circuit according claim 5, wherein said differential pair of transistors are input transistors for an operational amplifier.

* * * * *